United States Patent [19]
Jamison et al.

[11] Patent Number: 5,475,048
[45] Date of Patent: Dec. 12, 1995

[54] CONDUCTOR-FILLED THERMOSETTING RESIN

[75] Inventors: William L. Jamison, Fishers, Ind.; Andrzej Moscicki, Lodz, Poland

[73] Assignee: Thermoset Plastics, Inc., Indianapolis, Ind.

[21] Appl. No.: 163,398

[22] Filed: Dec. 7, 1993

Related U.S. Application Data

[63] Continuation of Ser. No. 863,452, Apr. 3, 1992, abandoned.

[51] Int. Cl.$^6$ .............................. C08K 3/08; H01B 1/02
[52] U.S. Cl. ..................... 524/439; 524/440; 252/511; 252/512; 252/513; 252/514
[58] Field of Search ................................ 524/439, 440; 252/511–514; 525/193

[56] References Cited

U.S. PATENT DOCUMENTS

| | | | |
|---|---|---|---|
| 3,903,027 | 9/1975 | Johnson | 260/23 |
| 4,288,571 | 9/1981 | Comstock et al. | 523/514 |
| 4,327,369 | 4/1982 | Kaplan | 357/72 |
| 4,767,806 | 8/1988 | Cesare et al. | 523/514 |
| 5,158,708 | 10/1992 | Yamamoto et al. | 252/512 |
| 5,250,228 | 10/1993 | Baigrie et al. | 252/511 |

FOREIGN PATENT DOCUMENTS

| | | |
|---|---|---|
| 99717 | 2/1984 | European Pat. Off. . |
| 0102930 | 9/1978 | Japan . |
| 0223872 | 11/1985 | Japan . |
| 1103906 | 5/1986 | Japan . |
| 3095275 | 4/1988 | Japan . |
| 1251625 | 10/1989 | Japan . |
| 3152177 | 6/1991 | Japan . |
| 1372608 | 10/1974 | United Kingdom . |

OTHER PUBLICATIONS

"An Overview of Soldering and Solder Paste: Technology and Applications", *Hybrid Circuit Technology*, by J. S. Hwang, Sep. 1989, pp. 27–32.
"Conductive Epoxy Is Tested For SMT Solder Replacement", *Electronic Packaging and Production*, by R. Pound, Feb., 1986.
Hysol Electronics Chemicals Technical Information Bulletin E6–232C, Hysol Electronic Chemicals, Jul. 1986.
Hysol Electronics Chemicals Technical Information Bulletin E6–233A, Hysol Electronic Chemicals, Mar. 1987.
"Polyurethane Low Profile Additives For RP", by K. B. Chandalia, et al., 38th Annual Conference, Reinforced Plastics/Composites Institute, The Society of the Plastics Industry, Inc., Feb. 7–11, 1983.
*Urralloy®* Hybrid Polymer LP 85–05 Product Data Sheet, Olin Chemicals, 1986.
High Purity Silver Powder & Silver Flake, Amepox Product Literature, 1991.

*Primary Examiner*—Tae H. Yoon
*Attorney, Agent, or Firm*—Barnes & Thornburg

[57] ABSTRACT

Conductor-filled thermosetting resins having a free radical based cure chemistry are prepared for use as solder paste replacements for electrical conducting attachments of surface mount electronics components to printed circuit boards and as a die attach adhesive. The thermosetting resins exhibit rheological properties that allow them to be substituted for state-of-the-art solder paste and die attach adhesives. The conductor filled resins can be thermally cured in in-line processing operations to provide a low stress, substrate adherent, electrically conductive resin matrix.

17 Claims, No Drawings

CONDUCTOR-FILLED THERMOSETTING RESIN

This is a continuation of Ser. No. 07/863,452, filed Apr. 3, 1992, now abandoned.

FIELD OF THE INVENTION

This invention relates to conductor-filled thermoset resins. More particularly this invention is directed to resin formulations that are readily set to an electrically conductive, low stress, matrix by a thermally initiated free radical reaction. The conductor-filled resins are characterized by chemical and physical properties which render them uniquely adapted for surface mount and die attach applications.

BACKGROUND AND SUMMARY OF THE INVENTION

Common to the manufacture of all electronic devices is the formation of electrically conductive connections and bonds between cooperating microelectronic components. It is important, indeed critical, to device performance that the electrically conducting interconnections of device components are made as dependable as the device components themselves. Yet there are many practical considerations, not the least of which is manufacturing cost, which often dictate the nature of the process steps on the assembly line. Electronics device manufacturers and their suppliers have invested in a significant ongoing research and development effort to define new materials and processes for forming reliable electrically conductive connections for electronic device manufacture. The goal of many of such efforts has been to define new conductive adhesives that exhibit good processability and provide reliable product performance.

Two product areas that have been the target of significant research and development efforts are conductive adhesives for die attach (chip bonding) applications and solder paste used for board-level packaging—surface mount technology. Industry manufacturing practices for die attach include the use of thermoplastic (solvent containing) die attach adhesives, thermoset epoxies (both low temperature—slow curing for batch operations—and snap-cure epoxies, and solvent-based bismaleimide systems and polyamide systems, among others. State-of-the-art die attach materials are applied using either stamping or pin transfer, dispense or screen printing equipment. The die are then placed in contact with the adhesive which is typically batch cured in a forced air, recirculating oven. If the die attach adhesive contains a solvent, care must be taken to slowly remove the volatiles below the cure temperature to minimize void formation in the bond line. Such does not allow use of the more production efficient in-line automation for die attachment processes. While in-line curing has been detailed for certain snap-cure epoxy die attach adhesives, use of such compositions suffers the disadvantage of high rate of stress-related device failure, (especially for large chip manufacture) and corrosion due to extractable ionic species. There is clearly a significant need for the development of snap-cure conductive adhesives which avoid the known disadvantages of available snap-cure epoxies and other state-of-the-art die attach formulations.

Solder paste is a soldering material in paste form that readily adapts to automation, and accordingly has become the primary interconnecting material for board-level packaging. Solder paste is a mixture of a fusible metal powder with fluxes, activators, solvents, binders and other ingredients designed to give the paste its targeted rheology. The tacky characteristic of solder paste allows parts to be held in position without additional adhesives before permanent electrically conductive bonds are formed in the solder reflow process. The rheological properties of solder paste are such that it can be applied by mesh screen printing, metal stencil printing, pneumatic dot dispensing, positive displacement dispensing and pin transfer techniques. Metal mask stencil has become a popular means for solder paste application because of its compatibility with solder pattern and performance/maintenance advantages. Yet the use of solder paste for electrical conductive bonding is not without its disadvantages. Differential expansion between bonded surfaces leads to stress on solder joints leading to joint cracking and concomitant device failure. Further the use of solder paste in manufacturing operations typically results in high waste—the pastes are not rheologically stable when exposed to the air and therefore have short "open times". Significantly, too, there are environmental concerns associated with the high volume use of solder paste. The paste typically contain high levels of toxic metals, including lead. Further, following solder reflow, most manufacturing processes require cleaning of solder flux contaminants, which involve additional labor costs and capital equipment. Solvent cleaning is sometimes required; there are many environmental/health issues associated with the handling of chlorinated and fluorinated solvents.

Recognition of the disadvantages along with the high volume use of solder paste has provided significant incentive to develop solder paste replacement formulations. Paralleling the development of electrically conductive epoxy adhesives for die attach applications, metal filled conductive epoxies have also been proposed as solder paste replacements. Yet epoxy-based solder replacement formulations suffer from the same disadvantages, although of a lesser significance, seen with their use in die attach adhesives, and accordingly have not been accepted for production in industry. There is still a significant need in the electronics manufacturing industry to develop reliable, electrically conductive bonding materials which not only provide good performance properties but as well exhibit cost saving processability advantages.

Therefore, it is one object of this invention to provide a thermosetting resin formulation that can be thermally cured in in-line processing operations to provide a low stress, electrically conductive resin matrix.

It is another object of this invention to provide conductor-filled thermosetting resins which due to their free radical based cure chemistry not only exhibit good rheological stability at ambient temperature but can be induced to cure rapidly at temperatures of 150°–200° C.

Another object of this invention is to provide a thermosetting resin formulation that can be used as a solder paste replacement in surface mount printed circuit board manufacturing processes.

It is still another object of this invention to provide a thermosetting resin formulation utilizing a free radical propagated cure mechanism as a die attach adhesive.

Another object of this invention is to provide an improved method for electrically conductive attachment of surface mount electronics components to printed circuit boards utilizing a thermally initiated, free radical based curing conductor-filled resin formulation.

One other object of this invention to provide a die attach adhesive that can be fully cured in an in-line process with much reduced device failure due to stress failure.

Those and other objects of this invention are achieved by a conductor-filled thermosetting resin formulation comprising a free radical cross linkable polymer, a free radical initiating agent, and an unsaturated monomer capable of cross-linking the polymer. The cross-linking unsaturated monomer is preferably a bifunctional olefinic monomer having a boiling point greater than 200° C. at atmospheric pressure. The thermosetting resin of this invention optionally includes a low shrink or low profile thermoplastic resin to reduce shrinkage and concomitant internal stress in the cured resin. The resin formulations can be cured to form a shape-retaining electrically conducting resin matrix in less than 5 minutes, more typically less than 2 minutes, at a temperature of 200° C. or below. Physical and chemical properties of the resin formulations allow them to be used for die attachment and surface mount applications with little or no revision to existing manufacturing protocols.

DETAILED DESCRIPTION OF THE INVENTION

In accordance with the present invention there is provided a thermosetting resin formulation which can be cured through a free radical cross-linking/polymerization mechanism to provide electrically conductive resin matrices. The present resin formulations are in the form of a thixotropic fluid/paste having rheological characteristics that will allow it to be substituted for state-of-the-art die attach and solder paste formulations.

Generally the resin formulations of this invention comprise a free radical cross-linkable polymer, an unsaturated monomer capable of cross-linking the polymer, a free radical initiating agent, and an electrically conductive microparticulate filler. In one preferred embodiment, the present formulation further comprises a thermoplastic resin, most preferably a low shrink or low profile thermoplastic resin which functions to reduce post-cure stress in the cured electrically conductive matrix. Other optional additives can be employed to optimize chemical and rheological characteristics. For example, a small amount of a polymerization inhibitor can be added to enhance "open time" and shelf life. In addition, coupling agents can be added to improve "wetting" of the electrically conductive microcparticulate filler component and, as well, to improve adhesion characteristics of the cured conductive resin matrix.

The present formulations comprise about 15 to about 60 weight percent of a resin component. The resin component of the present formulation comprises about 30 to about 100 weight percent, more typically from about 30 to about 80 weight percent, and most preferably about 35 to about 75 weight percent of a free radical cross-linkable polymer. Such cross-linkable polymers include the commercially available thermosetting, unsaturated polyesters, vinyl esters, polybutadiene homopolymers and co-polymers having pendant 1,2-vinyl groupings, and other unsaturated pre-polymers prepared by partial polymerization of bifunctional olefinic monomers such as divinylbenzene, diallyl isopthlate or diallyl isopthalate, and other polymeric compounds having pendant unsaturated groups capable of undergoing free radical polymerization itself or co-polymerization with unsaturated monomer components. Most preferred of the free radical cross-linkable polymers are those that exhibit high free radical initiated cure rates in the presence of a monomer cross-linking agents. Vinyl esters and commercial polyesters prepared from maleic or fumaric acid with dihydric alcohols such as ethylene glycol, propylene glycol, butylene glycol, diethylene glycol, dipropylene glycol or triethylene glycol are preferred reactive free radical cross-linkable polymers.

The resin composition of the present formulation is formulated to contain about 0 to about 70 weight percent of an unsaturated monomer capable of cross-linking the cross-linkable polymer. The monomer and the free radical cross-linkable polymer are selected so that they form a homogeneous mixture. The monomer is generally of the vinyl type (including at least one group —C=CH$_2$ in each molecule). Commercially available monomers include styrene, vinyl toluene, methyl methacrylate, methyl styrene, divinylbenzene, divinylpyridine, diallyl phthalate and diallyl isopthalate. Monomers exhibiting low vapor pressure (having a boiling point, for example, > 200° C.), are preferred. Bifunctional olefinic monomers are used to prepare preferred thermosetting resin formulations of the invention. Diallyl phthalate is most preferred. Its high boiling point and concomitant low volatility allows curing of the present resin formulations even in thin films without premature loss (evaporation) of the monomer component. There are commercially available liquid cross-linkable polymers, such as Ricon® brand high vinyl 1–2 vinyl liquid polybutadiene that are free radical cross-linkable without added monomer. Such polymers can be used neat as the sole resin component of the formulation or with minor amounts of monomer added only for viscosity control.

The present thermosetting resin formulation further comprises about 40 to about 85 weight percent, more preferably about 50 to about 80 weight percent, of an electrically conductive microparticulate filler. A wide variety of microparticulate fillers are commercially available. They include microparticulate metals including silver, gold, platinum, palladium, nickel and copper. The conductive microparticulate compositions can be in the form of powders, flakes, or coated metal, glass, or ceramic particles. The nature of the electrically microparticulate filler is not critical except to the extent that the filler should be used in a quantity and of a nature such that the cured resin has a resistivity of less than about $10^{-3}$ ohms per centimeter, preferably less than $10^{-5}$ ohms per centimeter. One electrically conductive microparticulate filler that has imparted favorable conductivity characteristics to the cured resin and, as well, favorable rheological properties to the pre-polymerized resin formulation is silver powder/flakes having a tap density > 3.0. In a most preferred thermosetting resin formulation of this invention, the electrically conductive microparticulate filler comprises silver flake having a tap density of > 4.0. Such high tap density silver flake is commercially available as product AX10C from Amepox Microelectronics Ltd. of Lodz, Poland. Thermosetting resin formulations of this invention that have performed particularly well in solder paste applications have been formulated using mixtures of the very high tap density silver flake with other silver particulates of somewhat lower tap density. It has been found that rheological characteristics of the resin formulation, for example the thixotropic index which is important for processability in many applications, can be adjusted by adjusting the ratio of high tap density and low tap density silver powder components.

One other component of the thermosetting resin formulation of the present invention is a free radical initiating agent. That component is added in an amount sufficient to promote short cure times for the thermosetting resin formulations at temperatures of about 200° C. or below. Preferably the free radical initiator is added in an amount effective to promote a short resin cure cycle—the resin formulation should cure to a shape-retaining electrical conductive matrix in about 30 seconds to about 5 minutes at a temperature of about 100° to about 200° C. Most preferably the resin formulation should be formulated to cure to a shape-retaining electrically conductive resin matrix in less than about 2 minutes at about 150° C. to about 200° C. The free radical initiators are typically peroxide or other free radical initiators which are stable at room temperatures, but decompose at elevated temperatures to propagate free radical polymerization and concomitant cure of the resin formulation. Many organic peroxides detailed for use as free radical initiators are commercially available. Examples of such peroxide include dicumyl peroxide, di-t-butyl peroxide, t-butyl perbenzoate, t-butyl peroxy-2-ethylhexylcarbonate, t-butyl peroctoate, 2,5-dimethyl 2,5-di(2-ethylhexanoylperoxy)hexane, t-amyl perbenzoate, and t-amyl peroctoate. Typically the free radical initiating agent is used at less than 1 percent by weight of the resin composition, more preferably less than 0.5 percent by weight.

In a preferred embodiment of this invention the resin component of the thermosetting resin formulation further comprises from about 5 to about 35 weight percent, more preferably from about 10 to about 30 weight percent of a thermoplastic resin, preferably a low shrink or a low profile thermoplastic resin. Importantly the thermoplastic resin should be compatible with (miscible or soluble in) the resin composition component of the thermosetting formulation. The effect of the thermoplastic resin in the thermosetting system is to reduce the intrinsic shrinkage of the curing system and concomitantly to reduce the internal stress in the cured resin matrix. Thus electrically conductive resin matrices prepared by thermosetting (curing) resin formulations in accordance with this invention, including effective amounts of one or more thermoplastic resin components, exhibit reduced cracking during resin cure and during thermal cycling commonly associated with electronics device usage. The use of low shrink or low profile thermoplastic resin additives in the present thermosetting resin formulations is particularly advantageous in resin formulations adapted for die attach applications. Numerous low shrink and low profile thermoplastic resins are detailed in the technical and commercial literature. Exemplary of such additives are styrene polymers and co-polymers, polyethylene, polyvinyl chloride, polyvinyl alcohol, methacrylate polymers and co-polymers, polycaprolactones, saturated polyesters, polyurethane polymers, and elastomeric additives such as styrene butadiene rubber. Exemplary of commercially available low profile thermoplastic resins for use in the present resin formulations are the Uralloy® hybrid polymer LP85-05, a low profile modified polyurethane sold by Olin Chemicals, Stamford, Conn., and the Leguval® thermoplastic resins, including Leguval KU3-7248, Leguval KU3-7232B, and Leguval KU3-7258, all sold by DSM Resins of Zwolle, The Netherlands.

The thermosetting resin formulations of this invention include other additives to complement the physical and chemical properties of the formulation. Thus, for example, one or more commercially available coupling agents can be employed to facilitate blending of the conductive microparticulate filler with the resin composition. Coupling agents, for example, organofunctional silane coupling agent sold by Union Carbide, can be employed, often in trace amounts, but generally from about 0.1 to about 0.5 weight percent based on the weight of the resin composition, not only to facilitate blending of the resin formulation, but further to promote adhesion of the formulation to the substrate surfaces to which it is applied. Another additive that has been found useful at trace levels (generally less than 0.1 weight percent based on the resin formulation) is a polymerization inhibitor which functions to prevent premature polymerization of the resin formulation and thus enhances shelf life and "open time". Exemplary of such inhibitors are hydroquinone, p-methoxy phenol, and 2,6-di-t-butyl phenol.

In a preferred embodiment of the resin formulation of the present invention, the formulation comprises from about 20 to about 50 weight percent of a resin composition comprising about 50 to about 90 weight percent of a vinyl ester or a highly reactive unsaturated polyester, and about 10 to about 50 weight percent of a bifunctional olefinic monomer selected from the group consisting of divinyl benzene, divinyl pyridine, diallyl phthalate and diallyl isophthalate. The preferred formulation further comprises from about 50 to about 80 weight percent of an electrically conductive microparticulate filler comprising a metal selected from the group consisting of silver, gold, palladium, platinum, nickel and copper, most preferably silver powder or silver flake having a tap density > 3.0. The resin composition further comprises a free radical initiating agent in an amount effective to promote thermosetting of said formulation to a shape-retaining, electrically conductive resin matrix in about 30 seconds to about 5 minutes at about 100° to about 200° C. Most preferably the formulation can be thermoset to a shape-retaining, electrically conductive resin matrix in less than 2 minutes at a temperature of about 150° to about 200° C.

The thixotropic electrically conductive resin formulation of the present invention can be prepared using conventional resin/paste mixing/blending equipment. The compositions are optionally prepared utilizing a conventional 3-roll mill. Typically the resin components including the optional thermoplastic resin, polymerization inhibitor, or coupling agent are first blended and the resulting resin composition blend is combined with at least a major portion of the conductive filler and thereafter the remaining portion of the conductive filler is added and blended in the composition.

The conductor-filled thermosetting resin formulations of this invention find specific application as die attach adhesives and as solder paste replacements for electrically conductive attachment of surface mount electronics components to printed circuit boards. The present conductor-filled resin formulations can be prepared to have viscosities typically ranging from about 30,000 to about 400,000 centipoise and further can be formulated to have rheological properties which permit direct substitution of the present conductor filled resin formulations for state-of-the-art solder paste and die attach adhesive compositions without significant, if any, modification of existing manufacturing protocols. Indeed, use of the present resin formulations in both die attach and solder paste replacement applications offers multiple cost-saving advantages, not only in terms of processability, but as well in product performance. Those advantages derive not only from the inherent purity of the present formulations, but further from the inherent low stress condition of the cured conductive resin matrices and in the elimination of problems associated with the use of solvents, either in the use of formulations per se (i.e., void formation at the bond line in die attach applications) and elimination of the solvent cleaning required for most metal reflow solder paste in surface mount applications.

The invention is further described with reference to the following examples.

In the following examples Hetron® 912 is a vinyl ester resin sold by Ashland Chemical, Inc. DAP is the notation for diallyl phthalate. Catalysts 331, 575 and 256 are the free radical initiating catalysts 1,1-di-t-butylperoxycyclohexane; t-amyl peroctoate; and 2,5-dimethyl 2,5-di(2-2-ethylhexanoylperoxy)hexane, respectively, sold under the trade name Lupersol. Leguval® resins are thermoplastic resins available from DSM. The coupling agent A-187 silane is gamma-glycidoxypropyltrimethoxysilane, an epoxide functional coupling agent sold by Union Carbide. The silver powder/flakes identified as AX10C and AX20L are silver flake products available from Amepox. AX10C is a silver semi-flake product having a tap density of about 4.8 to about 5.6. AX20L is a silver flake product having a tap density of about 3.1 to about 3.6.

Several test resin compositions for use in the present conductor filled resin formulations were prepared to evaluate viscosity and cure time. The results of that test are shown in Table 1.

A resin formulation having the following formula was prepared as a solder paste replacement.

| SOLDER PASTE | |
| --- | --- |
| Hetron 912 Resin | 42.25 |
| DAP Monomer | 36.75 |
| **Leguval 7232B Solids | 21.00 |
| *Hydroquinone Solution | 0.05 |
| Lupersol 575-P75 | 2.00 |
| 5.30 Tap Density Silver | 204.00 |
| 3.35 Tap Density Silver | 204.00 |
| A-187 Silane | 0.38 |
| | 510.43 |

TABLE 1

| Formula | Composition/pbw | | Viscosity/Brookfield #4, 10 rpm, 25° C. (cP) | Cure Time (average) 150° C. (sec) | Cure Time (average) 175° C. (sec) |
| --- | --- | --- | --- | --- | --- |
| A 331 | Hetron 912/65 pbw DAP/35 pbw Catal. 331/2 pbw | | 4700 | 17.5 | 13.4 |
| B 575 | Hetron 912/65 pbw DAP/35 pbw Catal. 575/2 pbw | | 4560 | 11.5 | 9.3 |
| E 256 | Hetron 912/65 pbw DAP/35 pbw Catal. 256/2 pbw | | 5560 | 8.2 | 7.6 |
| L 575 | Hetron 912/65 pbw DAP/35 pbw | 65 pbw | 9200 | 17.6 | 17.6 |
| | Leguval KU3-17248/50 pbw DAP/50 pbw Catal. 575/2 pbw | 35 pbw | | | |
| LK 575 | Hetron 912/65 pbw DAP/35 pbw | 65 pbw | 5000 | 16.8 | 16.2 |
| | Leguval KU3-17248/60 pbw DAP/40 pbw Catal. 575/2 pbw | 35 pbw | | | |

Each of Formulas A331, B575, and L575 were used to prepare silver filled resin formulations in accordance with the present invention. The resin formulations were prepared by blending the silver flake components into the prepared resin compositions. The data obtained upon assessment of the chemical and physical properties of the silver filled formulations is shown in Table 2.

TABLE 2

| FORMULA | | Initial Viscosity Stand. Brookfield #7, 2.5 rpm, 25° C. | Thixotropic Ratio (1:10 rpm) | Shrinkage Test mm (*) | Resistance (**) | Lap Shear (*) |
| --- | --- | --- | --- | --- | --- | --- |
| A 331 | −100 pbw | 154 000 | 3.7 | 0.734 | 0.12 ohm | ~1100 |
| AX10C | −350 pbw | | | | | |
| AX20L | −100 pbw | | | | | |
| B 575 | −100 pbw | 163 000 | 3.9 | 0.64 | 0.12 ohm | — |
| AX10C | −350 pbw | | | | | |
| AX20L | −100 pbw | | | | | |
| L 575 | −100 pbw | 325 000 | 2.2 | 0.0 | 0.1 ohm | ~600 |
| AX10C | −250 pbw | | | | | |
| AX20L | −100 pbw | | | | | |

*Curing 175° C. — 15 minutes — For stimulation long term work.
**Curing 175° C. — 2–3 minutes — After this time was no change of resistance.

-continued

*Hydroquinone Solution

| | |
|---|---|
| Hydroquinone | 0.66 |
| Styrene T-50 | 7.44 |
| Cellosolve Glycol EE | 6.90 |

**Leguval 7232B is a solution of a saturated polyester urethane (71% weight) in styrene.

The solder paste replacement formulation was tested as a replacement for solder paste used in a stencil-printed solder paste application. The formulation was substituted for a state-of-the-art solder paste composition. The solder paste replacement exhibited stencil printability in a 20 mil pitch pattern.

We claim:

1. A thermosetting resin formulation comprising about 15 to about 60 weight percent of a resin composition comprising about 30 to about 80 weight percent of a free radical cross-linkable unsaturated polyester or vinyl ester, about 5 to about 35 weight percent of a thermoplastic resin and about 0 to about 70 weight percent of an unsaturated monomer capable of cross-linking the cross-linkable polyester or vinyl ester, about 40 to about 85 weight percent of an electrically conductive microparticulate filler, and a free radical initiating agent in an amount effective to promote thermosetting of said formulation to a shape retaining electrically conducting resin matrix in about 30 seconds to about 5 minutes at about 100° to about 200° C.

2. The resin formulation of claim 1 wherein the monomer is selected from the group consisting of divinylbenzene, divinylpyridine, diallyl phthalate and diallyl isopthalate.

3. The resin formulation of claim 1 wherein the electrically conductive microparticulate filler comprises a metal selected from the group consisting of silver, gold, platinum, palladium, nickel and copper.

4. The resin formulation of claim 3 wherein the electrically conductive microparticulate filler comprises a silver having a tap density > 3.

5. The resin formulation of claim 4 wherein the electrically conductive microparticulate filler is silver powder or silver flake having a tap density of > 4.

6. The resin formulation of claim 1 wherein the unsaturated monomer is diallyl phthalate or diallyl isopthalate.

7. The resin formulation of claim 6 wherein the electrically conductive microparticulate filler comprises a metal selected from the group consisting of silver, gold, platinum, palladium, nickel and copper.

8. The resin formulation of claim 7 wherein the electrically conductive microparticulate filler comprises silver flake or silver powder having a tap density of > 3.0.

9. The resin formulation of claim 8 wherein the electrically conductive microparticulate filler comprises silver powder or silver flake having a tap density of > 4.0.

10. The resin formulation of claim 1 comprising about 20 to about 50 weight percent of a resin composition comprising about 50 to about 80 weight percent of a vinyl ester or an unsaturated polyester, about 10 to about 30 weight percent of a thermoplastic resin, and about 10 to about 50 weight percent of a bifunctional olefinic monomer selected from the group consisting of divinylbenzene, divinylpyridine, diallyl phthalate, and diallyl isophthalate, about 50 to about 80 weight percent of an electrically conductive microparticulate filler comprising a metal selected from the group consisting of silver, gold, palladium, nickel and copper, and a free radical initiating agent in an amount effective to promote thermosetting of said formulation to a shape-retaining, electrically conducting resin matrix in about 30 seconds to about 5 minutes at about 100° to about 200° C.

11. The resin formulation of claim 10 wherein the thermoplastic resin is a low profile thermoplastic resin.

12. The resin formulation of claim 11 wherein the free radical cross-linkable polymer is a vinyl ester.

13. The resin formulation of claim 12 wherein the unsaturated monomer is diallyl phthalate or diallyl isophthalate.

14. The resin formulation of claim 13 wherein the electrically conductive microparticulate filler comprises silver powder or silver flake having a tap density > 3.0.

15. The resin formulation of claim 14 wherein the free radical initiating agent is in an amount effective to promote thermosetting of said formulation to a shape-retaining, electrically conducting resin matrix in less than 2 minutes at a temperature of 200° C.

16. The resin formulation of claim 1 wherein the free radical initiating agent is in an amount effective to promote thermosetting of said formulation to a shape-retaining, electrically conducting resin matrix in less than 2 minutes at a temperature of 200° C.

17. The resin formulation of claim 1 further comprising about 0.05 to about 1 weight percent of an antioxidant.

* * * * *